United States Patent
Achard et al.

(10) Patent No.: US 6,356,743 B1
(45) Date of Patent: Mar. 12, 2002

(54) DEVICE FOR LINEARIZING TRANSMITTER AMPLIFIERS

(75) Inventors: Jacques Achard, Issy les Moulineaux; Richard Couty, Ermont; Frédéric Gourgue; Yann-Yves Lebret, both of Paris, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/120,505

(22) Filed: Jul. 23, 1998

(30) Foreign Application Priority Data

Jul. 24, 1997 (FR) .......................................... 97 09422

(51) Int. Cl.[7] .............................................. H04B 17/00
(52) U.S. Cl. ........................ 455/115; 455/103; 455/91
(58) Field of Search ............................... 455/115, 118, 455/119, 103, 91; 331/68, 176; 375/296, 297; 330/124 R

(56) References Cited

U.S. PATENT DOCUMENTS

| | | | |
|---|---|---|---|
| 4,398,296 A | * 8/1983 | Gott et al. | ................ 375/200 |
| 4,993,021 A | 2/1991 | Nannicini et al. | |
| 5,287,543 A | * 2/1994 | Wolkstein | ................... 455/13.3 |
| 5,524,285 A | * 6/1996 | Wray et al. | ................... 455/126 |
| 5,559,807 A | * 9/1996 | Heuvel et al. | ................ 370/347 |
| 5,574,980 A | * 11/1996 | Nomura | ........................ 455/63 |
| 5,933,766 A | * 8/1999 | Dent | ........................... 455/103 |

FOREIGN PATENT DOCUMENTS

EP 0522706 A2 1/1993

* cited by examiner

Primary Examiner—Daniel Hunter
Assistant Examiner—Alan T. Gantt
(74) Attorney, Agent, or Firm—Sughrue Mion, PLLC

(57) ABSTRACT

A device for linearizing transmitter amplifiers for transmitter equipment including a plurality of transmitters (11, 12, ... 1n), each including a transmitter amplifier (4) and not totally decoupled from each other, said device including means for controlling the transmission of linearization signals relative to each amplifier and means (6) for analyzing the corresponding amplified linearization signals to determine the non-linearities of said amplifier and applying to wanted signals a pre-correction (5) to compensate said non-linearities, said device being essentially characterized in that it includes central control means (8, 8', 10–20) for commanding the transmission of linearization signals relating to different transmitter amplifiers at different times.

6 Claims, 4 Drawing Sheets

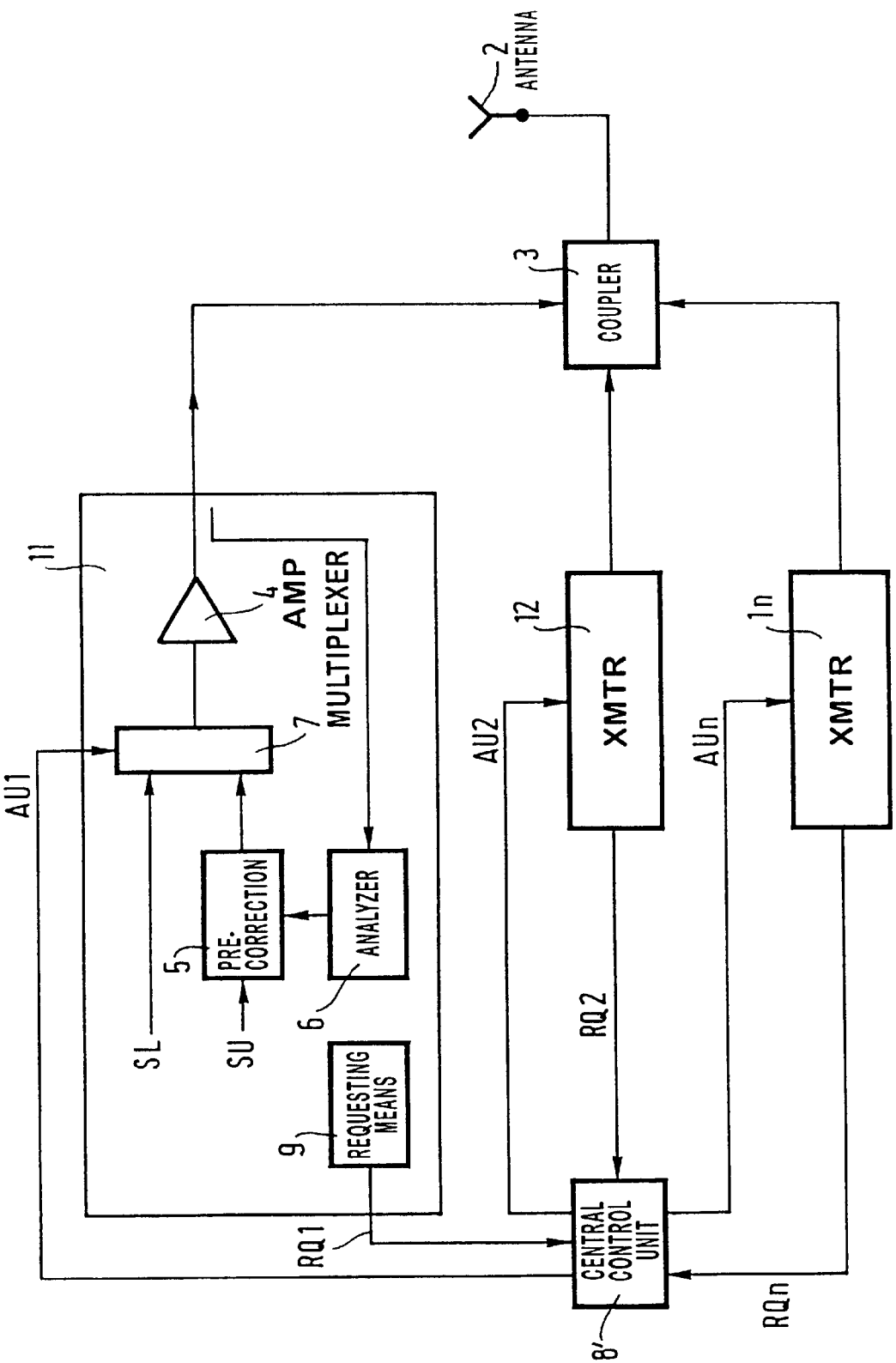

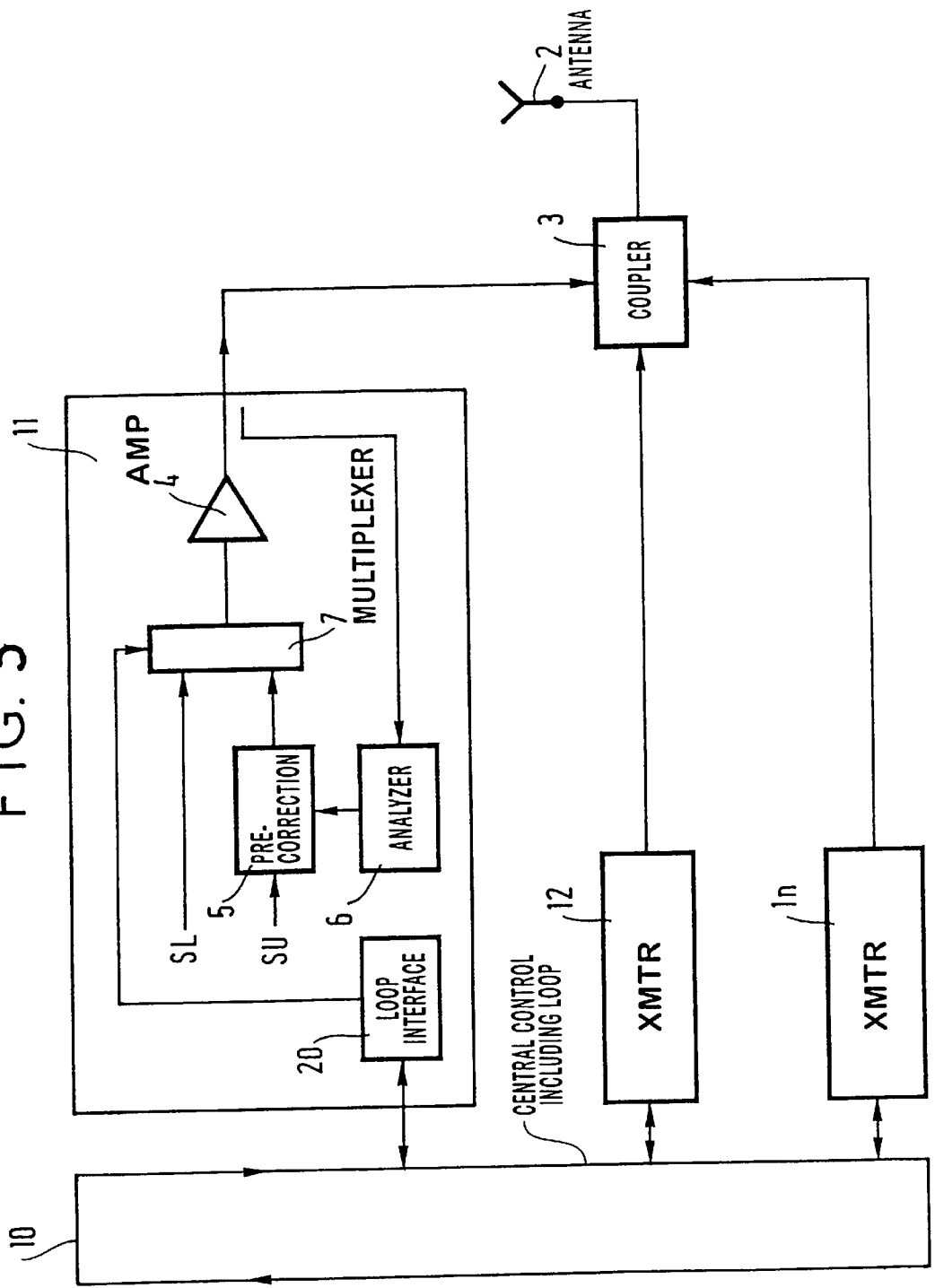

DEVICE FOR LINEARIZING TRANSMITTER AMPLIFIERS

BACKGROUND OF THE INVENTION

The present invention concerns the linearization of amplifiers, in particular the linearization of transmitter amplifiers used in transmitter equipment of radio communication systems, in particular mobile radio communication systems.

Known linearization techniques include those based on pre-correction applied to the signals to be amplified to compensate non-linear distortion caused by amplifying the signals.

Linearization techniques based on pre-correction require a knowledge of the non-linearities of the amplifier which is to be linearized. They can be determined once and for all, before the amplifier goes into service, or after the amplifier goes into service, by transmitting test signals, referred to hereinafter as linearization signals, when this is deemed to be necessary and analyzing the corresponding amplified linearization signals to determine the non-linearities of the amplifier and applying corresponding pre-correction to the wanted signals to be amplified by the amplifier.

A problem arises if the transmitter equipment includes a plurality of transmitters that are not totally decoupled from each other.

This situation arises if the capacity of the transmitter equipment is increased by using a plurality of transmitters which transmit in different frequency bands and are connected to the same antenna via a coupler or separately connected to different antennas. As the transmitters are not perfectly isolated from each other, either because the coupler used is not an ideal device or simply because of the geographical proximity of the various antennas, linearization signals transmitted by different transmitters can interfere with each other. The non-linearities of each of the transmitter amplifiers cannot be determined accurately in this situation.

To solve this problem it is possible to isolate the transmitters more effectively from each other by using filters with very high attenuation. Such filters are costly and bulky, however. Such isolation can also be very difficult, or even impossible, to achieve in the case of transmitters operating in nearby frequency bands, because excessively high selectivity is then required.

Another solution would be to use a coupler of better quality, but the same cost disadvantage is then incurred as in the previous solution, or to move the antennas a sufficient distance apart, but this is not a realistic solution.

SUMMARY OF THE INVENTION

The essential aim of the present invention is to provide a solution to this problem which avoids these drawbacks and is simple to put into practise.

The present invention applies to any system, whether of the multiple access type or not, and in the case of a multiple access system irrespective of the mode of multiple access, including TDMA (Time Division Multiple Access), FDMA (Frequency Division Multiple Access) and CDMA (Code Division Multiple Access).

Accordingly, the present invention essentially consists of a device for linearizing transmitter amplifiers for transmitter equipment including a plurality of transmitters each including a transmitter amplifier and not totally decoupled from each other, said device including means for controlling the transmission of linearization signals relative to each amplifier and means for analyzing the corresponding amplified linearization signals to determine the non-linearities of said amplifier and applying to wanted signals a pre-correction to compensate said non-linearities, said device being essentially characterized in that it includes central control means for commanding the transmission of linearization signals relating to different transmitter amplifiers at different times.

BRIEF DESCRIPTION OF THE DRAWINGS

Other objects and features of the present invention will become apparent upon reading the following description of embodiments of the invention given with reference to the accompanying drawings, in which:

FIG. 4 is a block diagram illustrating one variant of the FIG. 1 block diagram, FIG. 5 is a block diagram illustrating another variant of the FIG. 1 block diagram.

DESCRIPTION OF PREFERRED EMBODIMENTS

Figure 1:
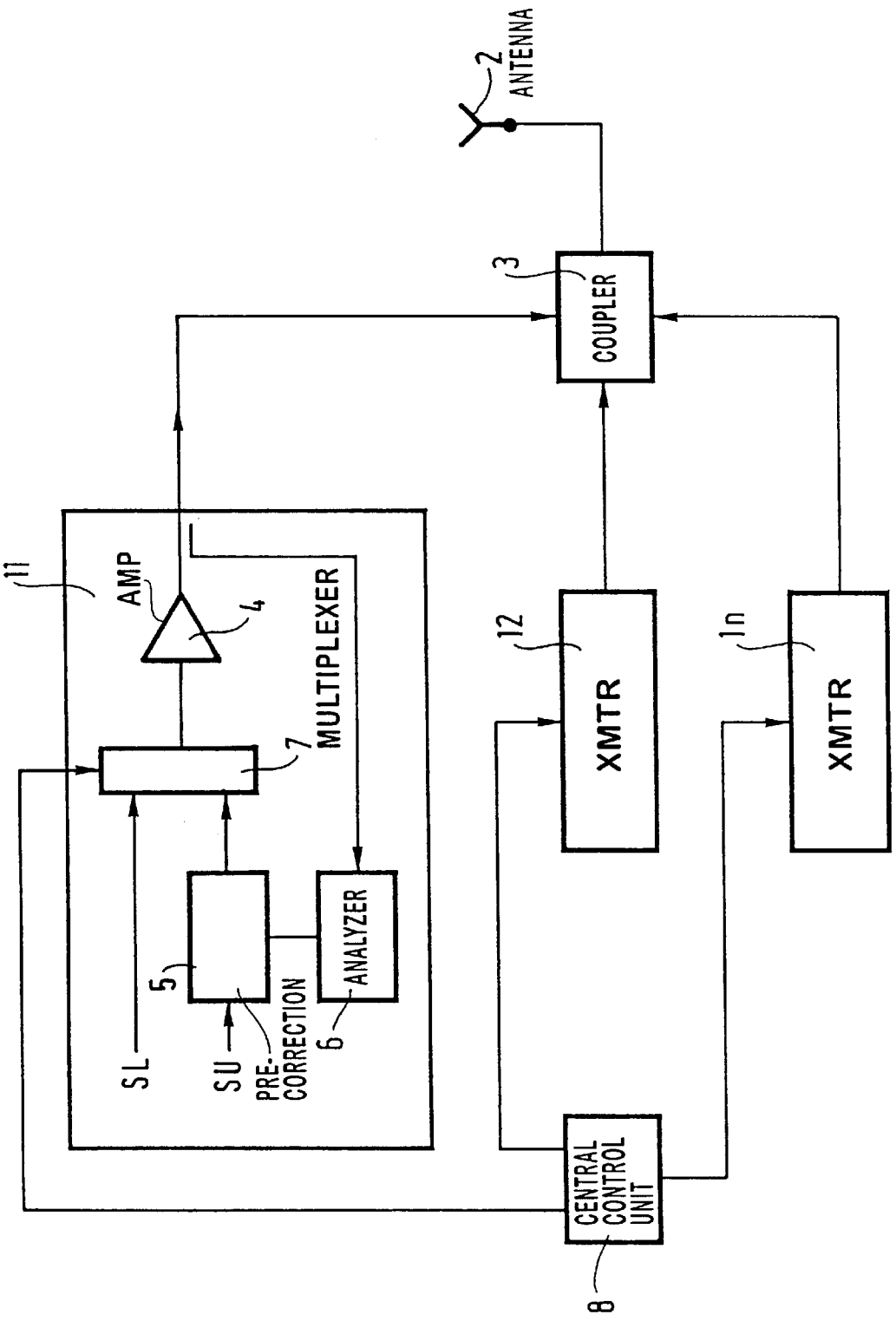
FIG. 1 is a block schematic showing transmitter equipment using a linearization device of the invention.

The transmitter equipment shown in FIG. 1 includes a set of transmitters 11, 12, . . . , 1n connected to the same antenna 2 by a coupler 3. For simplicity only transmitter 11 is shown in detail, the others being identical to it.

The transmitter 11 includes a transmitter amplifier 4 preceded by a pre-correction device 5.

The transmitter amplifier 4 receives wanted signals SU and linearization signals SL via multiplexing means 7 included in means for effecting the required multiple access in the case of a multiple access system.

The amplified linearization signals are analyzed by an analyzer device 6 to deduce from them the transfer function of the pre-correction device 5, i.e. the pre-correction to be applied to the wanted signals SU to compensate the non-linearities of the transmitter amplifier 4.

In a time division multiple access system the transmission time structure used is such that different logical time channels are assigned to transmitting different types of signals (such as traffic signals, control signals, signaling, etc). Each logical channel is divided into a succession of physical time channels, called time slots, in which bursts (signal elements) can be transmitted. One of these logical channels is the linearization logical channel assigned to transmitting linearization signals.

The transmitter equipment further includes, in accordance with the invention, central control means 8 which in a time division multiple access system of this kind command transmission of linearization bursts relating to different transmitter amplifiers in different physical time channels of said linearization logical time channel.

Figure 2:
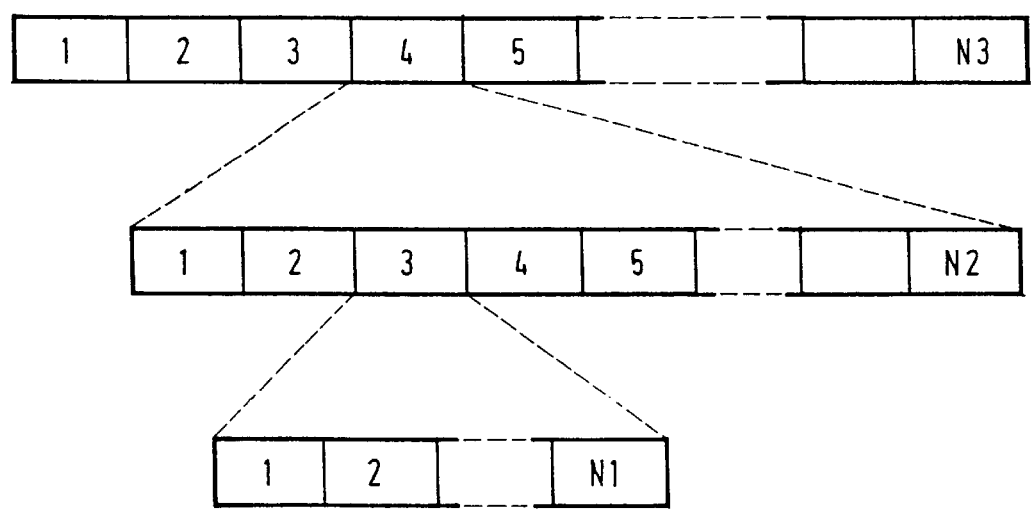
FIG. 2 is a diagram illustrating one example of a transmission time structure corresponding more particularly to a time division multiple access (TDMA) system, illustrating the principle of transmission of linearization signals in a system of this kind.

FIG. 2 illustrates one example of a possible time structure to illustrate the principle of such transmission of linearization bursts. A time structure with three levels is shown by way of example:

a first level corresponding to a frame made up of N1 time slots (IT), a second level corresponding to a multiframe made up of N2 frames, and a third level corresponding to a hyperframe made up of N3 multiframes.

This structure is repetitive and, in this example, a logical time channel can be formed of time slots with the same number i (where i is in the range 1 to N1) of successive frames, or time slots with the same number i of a given frame of successive multiframes, or time slots with the same number i of a successive given frame and given multiframe.

If the linearization logical channel is formed of time slots with the same number i in a given frame of successive multiframes, for example, the ith time slot of a given frame of the first multiframe of a hyperframe could therefore be assigned to transmission of linearization bursts of the transmitter amplifier of the transmitter 11, the ith time slot of a given frame of the second multiframe of the hyperframe could for example be assigned to transmitting linearization bursts of the transmitter amplifier of the transmitter 12, and so on up to the ith time slot of a given frame of the nth multiframe of this hyperframe which could for example be assigned to transmitting linearization bursts of the transmitter amplifier of the transmitter 1n.

Other assignments and other time structures are possible, of course.

The invention is not limited to an application to a time division multiple access system.

Figure 3:
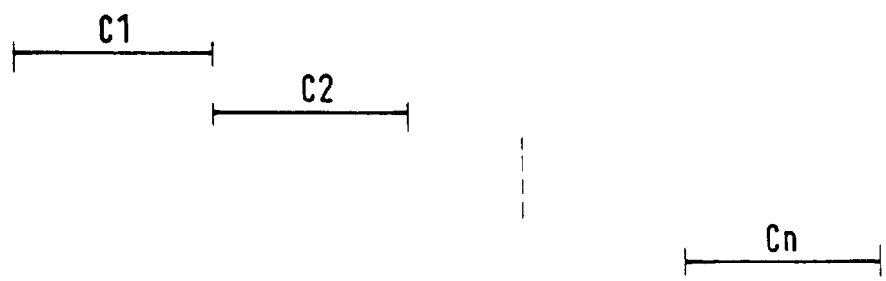
FIG. 3 is a diagram illustrating the principle of transmitting linearization signals in a system other than a time division multiple access system.

In a system other than a time division multiple access system (in particular a CDMA or FDMA system) different linearization transmission time channels are created and assigned to transmission of linearization signals such as the signals C1, C2, . . . , Cn in FIG. 3, and said central control means 8 command transmission of linearization signals relating to different transmitter amplifiers on separate linearization channels (for example, transmission of linearization signals relating to transmitter 11 on transmission channel C1, transmission of linearization signals relating to transmitter 12 on transmission channel C2, etc, up to transmission of linearization signals relating to transmitter 1n on transmission channel C1n).

To unify these various examples, it should be stated that the central control means command transmission of linearization signals relating to different amplifiers at different times.

In a first embodiment, such as the one illustrated by FIG. 1, the central control means 8 include means for allocating non-continuous lists of transmission times for linearization signals relating to different transmitter amplifiers of the transmitter equipment concerned. In the example shown in FIG. 1 the central control means 8 therefore control the multiplexing means such as the means 7 for the transmitter 11.

In another embodiment, such as the one illustrated by FIG. 4, a transmitter is authorized to transmit a linearization signal only after requesting to do so beforehand and the central control means 8' then issue authorizations AU1, AU2, . . . , AUn in response to requests RQ1, RQ2, . . . , RQn from the transmitters 11, 12, . . . , 1n to avoid transmission of linearization bursts relating to different transmitters at the same time. Means for generating such requests are then provided in each transmitter, such as the means 9 for transmitter 11. Such requests will generally be generated in accordance with the same criteria as those usually employed to initiate the transmission of linearization signals by transmitter equipment, including: time since last transmission of linearization signals, large temperature variations, temperatures exceeding a predetermined threshold, etc. In the example illustrated, authorizations AU1, AU2, . . . , AUn are applied to the various multiplexing means such as the means 7 of the transmitter 11.

In another example, such as the one illustrated by FIG. 5, said central control means include a loop 10 interconnecting said transmitters and means for circulating a token on this loop, only the transmitter holding this token at a given time being authorized to transmit a linearization signal at this time (this is similar to the token ring technique). Interface means with the loop are then provided in each transmitter such as the means 20 for the transmitter 11, the interface means further providing, in the example illustrated, the signals controlling the various multiplexing means such as the means 7 of the transmitter 11.

A more detailed explanation of the control means in any of these examples is not needed here since their implementation will be evident to the skilled person.

Note simply that these control means, which in accordance with the invention are therefore means for centralized control of the transmission of linearization signals by the various transmitter amplifiers of the transmitter equipment concerned, advantageously operate synchronously with the timebase of the transmitter equipment.

What is claimed is:

1. A device for linearizing transmitter amplifiers for transmitter equipment including a plurality of transmitters (11, 12, . . . , n), each including a transmitter amplifier (4) and not totally decoupled from each other, said device including means for controlling the transmission of test signals relative to each amplifier and means (6) for analzing the corresponding amplified test signals to determine the non-linearities of said amplifier and applying to wanted signals, amplified by said amplifier, a pre-correction (5) to compensate said non-linearities, said device being characterized in that it includes central control means (H, R', 10–12) for commanding the transmission of test signals, relating to different transmitter amplifiers, only at different respective times.

2. A device according to claim 1 characterized in that said transmitter equipment is used in a time division multiple access system using a transmission line structure including various logical tranmission time channels including a logical test channel assigned to the transmission of signals for linearizing said transmitter amplifiers, said logical channels being divided into physical transmission time channels, called time slots, in which bursts (signal elements) can be transmitted and in that said central control means (8, 8', 10–20) command the transmission of test bursts, relating to different transmitter amplifiers, in separate physical channels of said logical test channel.

3. A device for linearizing transmitter amplifiers for transmitter equipment including a plurality of transmitters (11, 12, . . . , n), each including a transmitter amplifier (4) and not totally decoupled from each other, said device including means for controlling the transmission of linearization signals relative to each amplifier and means (6) for analizing the corresponding amplified linearization signals to determine the non-linearities of said amplifier and applying to wanted signals a pre-correction (5) to compensate said non linearities, said device being characterized in that it includes central control means (8, 8', 10–12) for commanding the transmission of linearization signals, relating to different transmitter amplifiers, at different times, and said transmitter equipment is used in a system other than a time division multiple access system, in that different linearization transmission time channels are created and assigned to transmission of signals for linearizing said transmitter amplifiers, and in that said central control means (8, 8', 10–20) commands the transmission of linearization signals, relating to different transmitter amplifiers, on separate linearization channels.

4. A device according to claim 1 characterized in that said central control means (8) allocate non-continuous lists of transmission times for test signals relating to different transmitter amplifiers.

5. A device for linearizing transmitter amplifiers for transmitter equipment including a plurality of transmitters (11, 12, . . . , n), each including a transmitter amplifier (4) and not totally decoupled from each other, said device including means for controlling the transmission of linearization signals relative to each amplifier and means (6) for analizing the corresponding amplified linearization signals to determine the non-linearities of said amplifier and applying to wanted signals a pre-correction (5) to compensate said non linearities, said device being characterized in that it includes central control means (8, 8', 10–12) for commanding the transmission of linearization signals, relating to different transmitter amplifiers, at different times, and said control means (8') issue authorizations (AU1, AU2, . . . , AUn) for transmission of linearization signals in response to requests (RQ1, RQ2, . . . , RQn) from the transmitters in such manner as to avoid the transmission of linearization signals, relating to different transmitters, at the same time.

6. A device for linearizing transmitter amplifiers for transmitter equipment including a plurality of transmitters (11, 12, . . . , n), each including a transmitter amplifier (4) and not totally decoupled from each other, said device including means for controlling the transmission of linearization signals relative to each amplifier and means (6) for analizing the corresponding amplified linearization signals to determine the non-linearities of said amplifier and applying to wanted signals a pre-correction (5) to compensate said non-linearities, said device being characterized in that it includes central control means (8, 8', 10–12) for commanding the transmission of linearization signals, relating to different transmitter amplifiers, at different times, and said central control means include a loop (10) interconnecting said transmitters and means for circulating a token on said loop, only the transmitter having said token at a given time being authorized to transmit a linearization signal.

* * * * *